United States Patent [19]

Narita et al.

[11] Patent Number: 5,302,856
[45] Date of Patent: Apr. 12, 1994

[54] SEMICONDUCTOR RECTIFYING DEVICE AND FULL-WAVE RECTIFIER FABRICATED USING THE SAME

[75] Inventors: Kazutoyo Narita, Hitachi; Yoichi Nakashima, Ibaraki; Hiroshige Okinoshima, Annaka; Tadashi Nosaka, Kariya, all of Japan

[73] Assignees: Hitachi, Ltd.; Shin-Etsu Chemical Co., Ltd., both of Tokyo; Nippondenso Co., Ltd., Kariya, all of Japan

[21] Appl. No.: 772,871

[22] Filed: Oct. 8, 1991

[30] Foreign Application Priority Data

Oct. 8, 1990 [JP] Japan .................................. 2-270188

[51] Int. Cl.⁵ ............................................ H01L 23/02
[52] U.S. Cl. .................................... 257/788; 257/789; 257/790; 257/791; 257/795
[58] Field of Search ................... 357/72; 257/788, 790, 257/789, 791, 795

[56] References Cited

U.S. PATENT DOCUMENTS

| | | | |
|---|---|---|---|
| 4,305,088 | 12/1981 | Narita et al. | 357/72 |
| 4,720,424 | 1/1988 | Eickman et al. | 357/72 |
| 4,768,081 | 8/1988 | Moeller | 357/72 |
| 4,888,634 | 12/1989 | Lai et al. | 357/72 |
| 5,005,069 | 4/1991 | Wasmer et al. | 357/72 |
| 5,097,317 | 3/1992 | Fujimoto et al. | 357/72 |

FOREIGN PATENT DOCUMENTS 59-172749 9/1984 Japan .

*Primary Examiner*—William Mintel
*Assistant Examiner*—Roy Potter
*Attorney, Agent, or Firm*—Antonelli, Terry, Stout & Kraus

[57] ABSTRACT

A semiconductor rectifying device, suitable for installation in vehicles, comprises a cup-shaped metallic container, a semiconductor chip having a pn junction, one of whose main surfaces is bonded to the bottom surface of the container, a lead bonded to the other main surface of the semiconductor chip, and a silicone resin layer containing silica powder, with which layer an exposed portion of the semiconductor chip is covered.

17 Claims, 7 Drawing Sheets

SEMICONDUCTOR RECTIFYING DEVICE AND FULL-WAVE RECTIFIER FABRICATED USING THE SAME

BACKGROUND OF THE INVENTION

1. Field of the Invention

The present invention relates to a semiconductor rectifying device used to rectify the output of A.C. generators for use with vehicles and a full-wave rectifier fabricated by using the same device.

2. Description of the Related Art

Three-phase full-wave rectifiers of A.C. generators for vehicles comprise a pair of radiators used as terminals on the D.C. side, semiconductor rectifying devices, three of which are fixedly mounted on each pair of radiators, within which the rectifying directions are aligned and between which the rectifying directions are different, and three A.C.-side terminals, which are fixedly mounted on different radiators, for connecting the semiconductor rectifying devices. Resin sealing types are used for semiconductor rectifying devices in place of conventional canned sealing types due to the advancement of technology relating to stability. Because these semiconductor rectifying devices are placed near an engine and used under severe conditions, various improvements have been made on sealing resins up to the present time. A typical example of a sealing resin comprises a combination of (1) silicone resin and (2) an epoxy resin in which a silicone resin and $SiO_2$ powder are added, and is disclosed in Japanese Patent Laid-Open No. 59-172749 (1984).

Silicone resins are widely used as sealing resins for semiconductor rectifying devices because they have high resistance to heat and to moisture and excellent bonding properties with metals. However, since silicone resins have a large thermal expansion coefficient and a great shrinkage when cured, they are liable to peel away from metal in the bonding interface and there is a danger that defective electrical characteristics will occur in the semiconductor rectifying devices. Also, silicone resins are problematical in that they have a low resistance to salt damage. As the inventor of the present invention has confirmed, alkali is produced by electrolysis when semiconductor rectifying devices are tested with salt water. This alkali decomposes siloxane bonding, causing peeling of the bonding interface between metal and the silicone resin. This is a serious problem for semiconductor rectifying devices installed in vehicles used near the seaside or in snowy areas.

The above-described problem still exists even when a silicone resin and an epoxy resin are combined, namely, when an epoxy resin layer is laminated on a silicone resin layer. This is because the silicone resin has a thermal expansion coefficient greater than that of the epoxy resin. If a temperature cycle is added, the epoxy resin peels away from the metal on the close contact interface between them due to the expansion and contraction of the silicone resin. The bonding interfacing of the underlying silicone resin with the metal is placed under substantially the same conditions as in a single silicone resin body.

As described above, as long as well-known resins are used as sealing resins, semiconductor rectifying devices having excellent resistance to salt damage cannot be realized.

SUMMARY OF THE INVENTION

Accordingly, an object of the present invention is to provide a semiconductor rectifying device having excellent resistance to salt damage and a full-wave rectifier fabricated by using the same device.

Specifically, an object of the present invention is to provide a semiconductor rectifying device and a full-wave rectifier fabricated by using the same device, in which device the decomposition of siloxane bonding by alkali which is a weak point of the silicone resin and defective electrical characteristics due to contraction by hardening are eliminated without deteriorating the original resistance to heat and water vapor of the silicone resin.

The features of semiconductor rectifying devices which achieve the above-described objects according to the present invention are that they provide: a metallic container section, a semiconductor chip having a pn junction, one of whose main surfaces is bonded to the bottom surface of the container; a lead bonded to the other main surface of the semiconductor chip; and a silicone resin layer containing silica powder, with which layer the exposed portion of the semiconductor chip is covered. In the above description, the container refers to a cup-shaped container and a recessed section provided in a portion of a flat plate.

The silicone resins are broadly classified into one-component types of curable organopolysiloxane composition and two-component types. Each of them are further classified according to addition-type curable silicone compositions catalyzed by platinum compounds and condensation-type curable silicone compositions in which the condensation product may be acetic acid, an amine, an oxime, an ketone or an alcohol condensed by moisture in the air at room temperature. In the present invention, any silicone resin may be used. Preferably, silicone resins are used whose contraction by hardening is small and whose hardening time is short.

Silane compounds, for example, atomized silica obtained by burning $SiCl_4$; silicone compounds, for example, precipitated silica obtained by hydrolyzing $SiCl_4$; crystal silica obtained by grinding silicon, molten silica obtained by grinding silicon and then melting and further grinding it, etc., can be used for silica powder. From the viewpoint of reducing leakage of a reverse current of semiconductor rectifying devices, highly pure silica whose content ratio of Na and K are each 10 ppm or less and preferably 5 ppm or less, should be used. As regards the amount of silica powder to be added, it is required that 40 to 120 parts by weight of silica powder must be used with respect to 100 parts by weight of silicone resin. Preferably, 80 to 100 parts by weight should be used. The average particle size of silica powder is preferably 2 to 6 μm.

Various additives can be added as required in a silicone resin. For example, titanium oxide, carbon black and organic dyes may be added for the purpose of coloring; alkoxyl-silicone type compounds may be added for the purpose of providing or improving the bonding property; and metallic compounds or an organic oxidation preventing agent may be added for the purpose of increasing the resistance to heat.

Although silicone resin layers alone are adequate, it is also possible for resin layers to be placed thereon and other resin layers are interposed between them and the semiconductor chip.

Next, semiconductor rectifying devices of the present invention are characterized in that they are provided with a pair of radiators used as terminals on the D.C. side, semiconductor rectifying devices, a pair of which are fixedly mounted on each of the pair of radiators, within which a rectifying directions are aligned and between which the rectifying directions are different, and A.C.-side terminals, which are fixedly mounted on different radiators, for connecting the semiconductor rectifying devices, the number of the terminals are the same as the number of the phases of the A.C. side. Each semiconductor rectifying device comprises a semiconductor chip having a pn junction, one of whose main surfaces is bonded to the bottom surface of the container section, a lead bonded to the other main surface of the semiconductor chip, and a silicone resin containing silica powder, with which layer the exposed portion of the semiconductor chip is covered. The semiconductor chip is bonded by one of the following two methods: either to the bottom surface of a recessed section which has previously been formed in a radiator, or to a radiator which has previously been bonded in a container. The same can be said for silicone resins and silica powder.

Silica is stable with respect to alkali and has a thermal expansion coefficient smaller than that of silicone resin. For this reason, if silica powder is added to a silicone resin, the excellent properties of resistance to heat and water vapor of the silicone resin remain the same. The following improvements can be achieved: ① the stability of a silicone resin with respect to alkali is improved; ② the thermal expansion coefficient of a silicone resin is decreased; ③ the amount of of the thermal contraction of the silicone resin is reduced, etc. Thus, if a silicone resin in which silica powder is added is used as a sealing resin of a semiconductor rectifying device installed in vehicles, ① a peeling is unlikely to occur on the bonding interface between it and the metal and therefore, there is no danger that defective electrical characteristics of the semiconductor rectifying device will occur, ② the silicone resin is stable with respect to alkali, namely, the probability that silixane bonding will be decomposed by alkali is reduced greatly. Hence, the following advantages can be obtained: the incidence of peeling on the bonding interface with a metal is further reduced; and improved resistance to salt damage can be achieved. Highly reliable semiconductor rectifying devices suitable for installation in vehicles can be realized. The same advantages as above can be obtained in a full-wave rectifier fabricated by using such semiconductor rectifying devices.

These and other objects, features and advantages of the present invention will become clear when reference is made to the following description of the preferred embodiments of the present invention, together with reference to the accompanying drawings.

DESCRIPTION OF THE PREFERRED EMBODIMENTS

Figure 1:
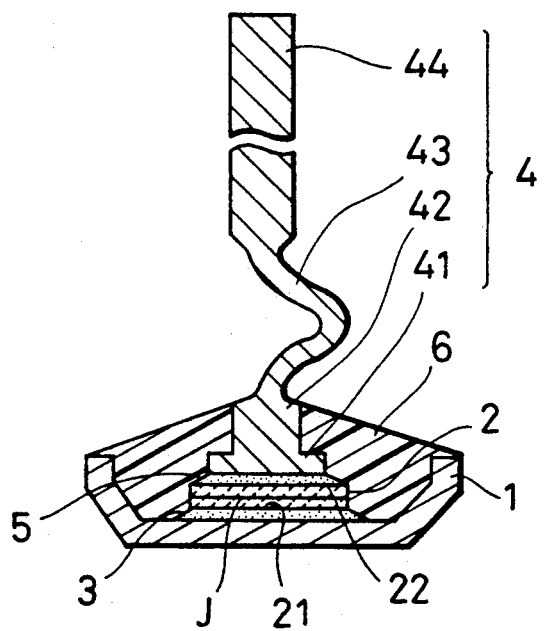
FIG. 1 is a schematic sectional view showing an embodiment of a semiconductor rectifying device of the present invention.

An embodiment of a semiconductor rectifying device and a full-wave rectifier fabricated by using the same device according to the present invention will be explained below with reference to the accompanying drawings. FIG. 1 shows a typical embodiment of a semiconductor rectifying device of the present invention. In FIG. 1, one of the main surfaces 21 of a semiconductor chip 2 having a p-n junction J is bonded, via a bonding layer 3, to the bottom surface of a metallic container 1. The other main surface 22 of the semiconductor chip 2 is bonded via a bonding layer 5 to a header section 41 of a lead 4. The lead 4 is formed, in addition to the header section 41, a first lead section 42 extending vertically with respect to the header section 41, a flat curvature section 43 contiguous to the first lead section 42, and a second lead section 44 contiguous to the curvature section 43. The metallic container 1 is filled with a silicone resin layer 6 in which silica powder is added. This layer 6 covers the exposed section of the semiconductor chip 2 and the surface of the layer 6 reaches the first lead section 42. For example, copper, iron nickel alloys, or copper-iron nickel alloy clad materials may be used for a material of the metallic container 1. The surface of the container should preferably be covered with silver or nickel plating to prevent rust. A material formed into one piece of copper and whose surface is plated with silver or nickel to prevent rust should preferably be used for the lead 4. The header section 41 is made of molybdenum, tungsten, and an iron-nickel alloy. A certain material with the first lead section 42, the curvature section 43 and the second lead section 44, all of which are made of copper, bonded thereon may be used. Pb-Sn or Pb-Ag-Sn solder is used for the bonding layers 3 and 5. The silica powder added in the silicone resin layer 6 is highly pure silica whose content of Na and K is, respectively, 10 ppm or less. The silica powder has an average particle size of 2 to 6 μm. The amount of silica powder is in the range of 40 to 120 parts by weight with respect to 100 parts by weight of a silicone resin. The reason why highly pure silica is used is that if much Na and K is contained in the silica, a current which flows through a sealing resin layer, i.e., a reverse leak current, will be large when semiconductor rectifying devices are placed in a reverse bias state, thereby deteriorating the characteristics of the semiconductor rectifying devices. From this viewpoint, it is ideal that the content of the Na and K in the silica powder be 5 ppm or less. If the average particle size of the silica powder is too small, it becomes difficult to add an amount thereof sufficient for achieving the objects of the present invention to a silicone resin. If the average particle size of the silica powder is too large, the silica powder is precipitated before the silicone resin is hardened, and the distribution of the silica powder inside the resin becomes nonuniform, making it impossible to achieve the objects of the present invention. Therefore, the particle size range within which the objects of the present invention can be achieved is determined. Furthermore, as regards the amount of the silica powder to be added, an amount sufficient to prevent peeling at the bonding interface of the metallic container 1 from the silicone resin layer 6 is 40 parts by weight or greater, preferably 80 parts by weight or greater. If too much silica powder is added, the viscosity of the silicone resin will increase and thus a filling operation becomes difficult to perform, or it becomes difficult for air bubbles inside to escape. Thus, there are some cases in which it cannot be used as a sealing resin. Therefore, the amount of silica powder added is 120 parts by weight or less, preferably 100 parts by weight or less.

Next, an explanation will be given on a method of manufacturing the semiconductor rectifying device shown in FIG. 1. First, a solder foil, the semiconductor chip 2, another solder foil, and the lead 4 are laminated on the bottom surface of the metallic container 1 and heated. Thus, a subassembly in which the metallic container 1, the semiconductor chip 2 and the lead 4 are made into one piece is formed. The metallic container 1 of this subassembly is filled with a liquid silicone resin which is prepared and purified so that 40 to 120 parts by weight of highly pure silica powder having an average particle size of 2 to 6 μm are contained therein with respect to 100 parts by weigh of base oil compound comprising a dimethylpolysiloxane oil having vinyl groups bonded to silicone atom in its molecule, a methylhydrogenpolysiloxane having hydrogen atoms bonded to silicone atom in its molecule as a cross-linking agent, alkoxysilane type compound as a adhesive agent and a platinum type catalyst as main ingredients thereof. The liquid silicone resin is cured in a primary curing process in which it is heated at approximately 50° C. for two hours or more in the atmosphere or $N_2$ gas atmosphere. Furthermore, the liquid silicone resin is cured in a secondary curing process to strengthen the bonding between the metallic container, the semiconductor chip and the lead, in which process it is heated at 150° to 200° C. in the same atmosphere for two hours or more. Thus, the manufacturing of the semiconductor rectifying device is completed.

Points in which semiconductor rectifying devices constructed as described above and installed in vehicles can withstand severe conditions are confirmed by the following evaluation test. The evaluation test was carried out as follows: the following processes are regarded as being one cycle, ① a first process in which a device is placed in a reverse bias state and in a salt-water atomized atmosphere for a predetermined time,
② a second process in which a device is placed in a non-bias state and in a high temperature for a predetermined time,
③ a third process in which a device is placed in a reverse bias state and in a high temperature, high humidity atmosphere for a predetermined time,
④ a fourth process in which a device is placed in a non-bias state and in an atmospheric air for a predetermined time, this cycle being repeated a predetermined number of times. Whether the device is defective or not is determined by the number of cycles until reverse characteristics of the device deteriorate. The results of the evaluation test were as follows:

| Sample | Sealing Resin | Results |
| --- | --- | --- |
| 1 | Silicone resin layer only | X |
| 2 | Epoxy resin layer is formed on a silicone resin layer (50 percent by weight of $SiO_2$ powder added) | Δ |
| 3 | Silicone resin layer only (40 parts by weight of silica powder added) | ○ |
| 4 | Silicone resin layer only (100 parts by weight of silica powder added) | ⊙ |
| 5 | Silicone resin layer only (120 parts by weight of silica powder added) | ○ |

In this table, the x mark in the results indicates that the number of cycles up to the time the sealing resin deteriorates is very small and that the sealing resin cannot be used in a place where salt damage is expected; the Δ mark in the results indicates that the number of cycles is small and that use of the sealing resin in a place where salt damage is expected should be avoided; the ○ mark in the results indicates that the number of cycles is large and that the sealing resin can be used in a place where salt damage is expected; and the ⊙ mark in the results indicates a sealing resin better than that indicated by the ○ mark.

FIGS. 2 to 7 show different embodiments of a semiconductor rectifying device of the present invention.

Figure 2:
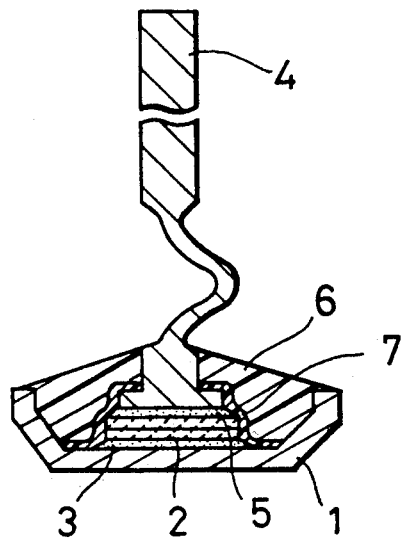
FIG. 2 is a schematic sectional view showing another embodiment of a semiconductor rectifying device of the present invention.
Figure 3:
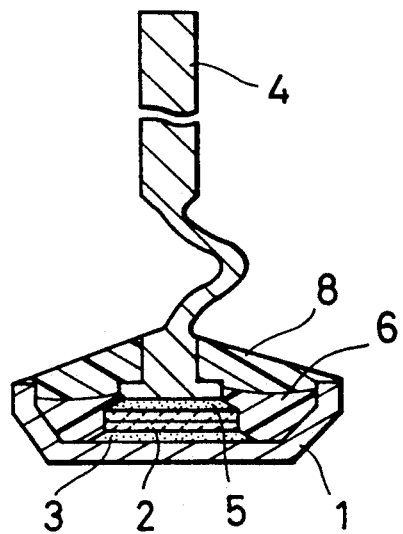
FIG. 3 is a schematic sectional view showing a further embodiment of a semiconductor rectifying device of the present invention.
Figure 4:
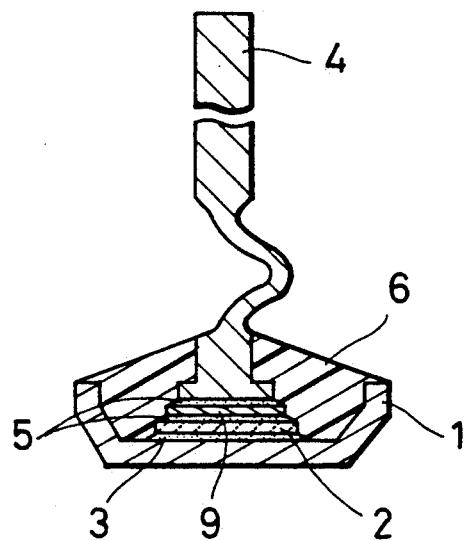
FIG. 4 is a schematic sectional view showing a still further embodiment of a semiconductor rectifying device of the present invention.
Figure 5:
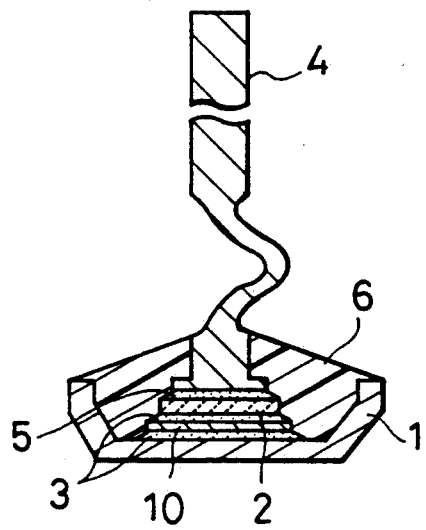
FIG. 5 is a schematic sectional view showing a still further embodiment of a semiconductor rectifying device of the present invention.

FIG. 2 shows an embodiment in which a polyimide resin layer 7 is interposed between the silicone resin layer 6 and the bottom surface of the metallic container 1, and between the semiconductor chip 2 and the header section 41 of the lead 4. FIG. 3 shows an embodiment in which an epoxy resin layer 8 is formed on the silicone resin layer 6. The other parts in FIGS. 2 and 3 are the same as those in FIG. 1. All the parts shown in FIGS. 2 and 3 are designed to increase the air-tight sealing function of a sealing resin. FIG. 4 shows an embodiment in which a metallic plate 9 is disposed between the semiconductor chip 2 and the header section 41. FIG. 5 shows an embodiment in which a metallic plate 10 is disposed between the semiconductor chip 2 and the metallic container 1. These metallic plates 9 and 10 are disposed to relieve thermal stress between the semiconductor chip 2 and the header section 41, and between the semiconductor chip 2 and the metallic container 1, respectively. Therefore, for example, molybdenum, tungsten, iron-nickel alloys, copper-iron nickel alloy copper clad materials are used for metallic plates 9 and 10. FIG. 4 shows a case in which the metallic container 1 is of a material having a thermal expansion coefficient nearly equal to that of the semiconductor chip 2. FIG.

5 shows a case in which the header section 41 is of a material having a thermal expansion coefficient nearly equal to that of the semiconductor chip 2. If both the metallic container 1 and the header section 41 are copper, it is desirable that the metallic plates 9 and 10 be placed on both sides of the semiconductor chip 2.

Figure 6:
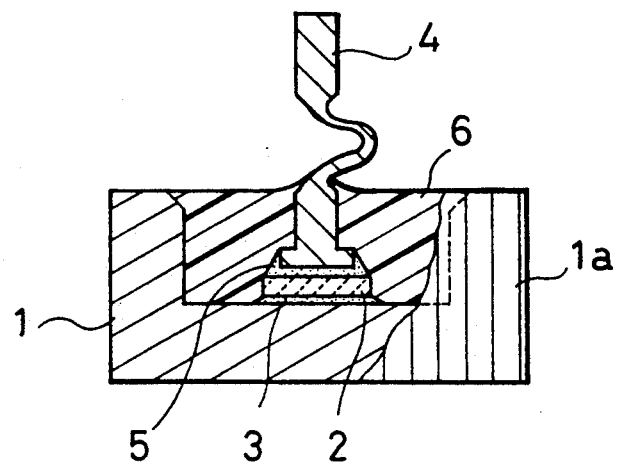
FIG. 6 is a schematic sectional view showing a still further embodiment of a semiconductor rectifying device of the present invention.

FIG. 6 shows an embodiment in which a knurling process 1a is performed on the outer surface of the metallic container 1 in the same direction as that in which the lead 4 extends. This obviates a bonding operation when a full-wave rectifier is fabricated.

Figure 7:
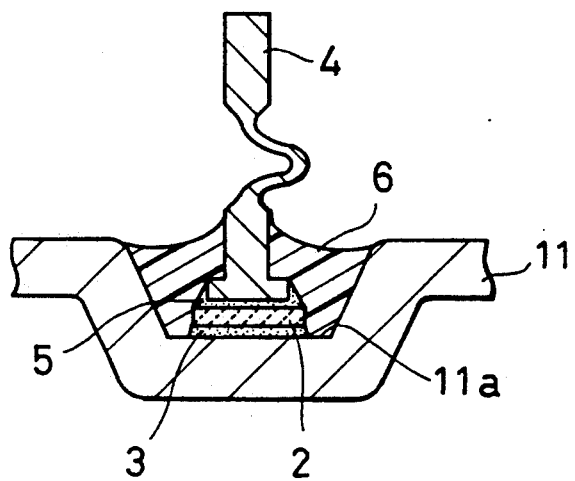
FIG. 7 is a schematic sectional view showing a still further embodiment of a semiconductor rectifying device of the present invention.

FIG. 7 shows an embodiment in which a recessed section 11a in a portion of the metallic container 1 is used in place of a metallic container.

Figure 8:
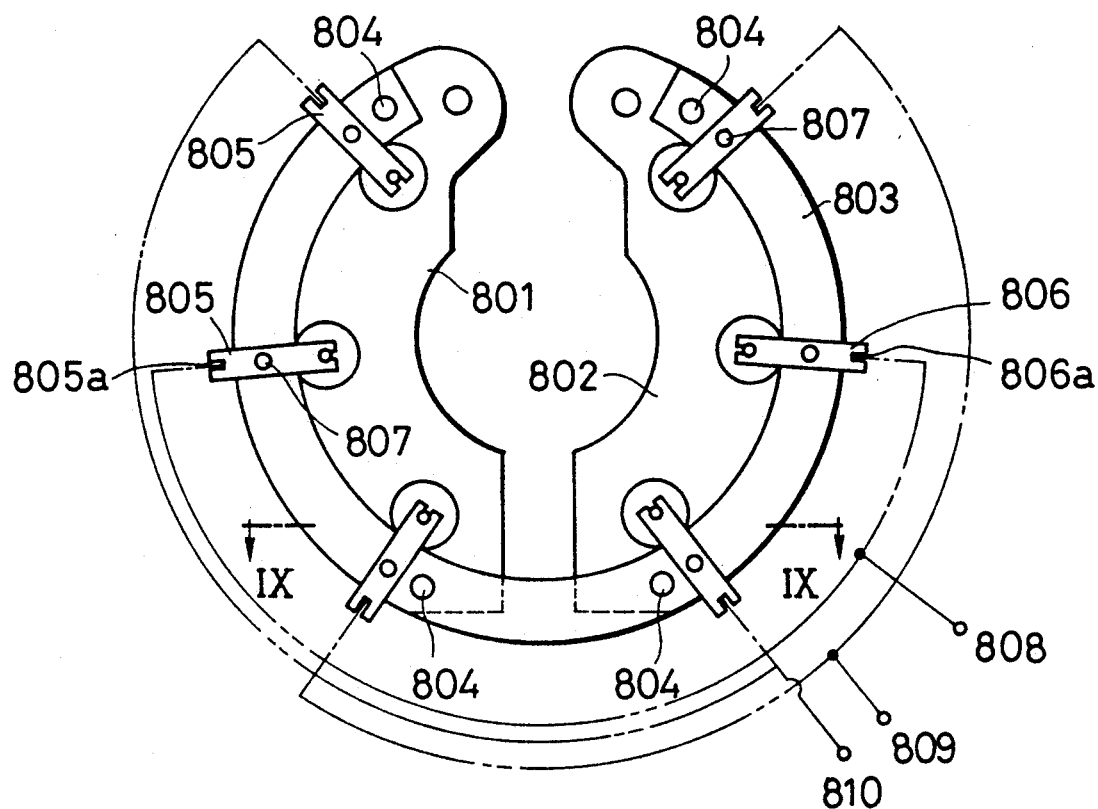
FIG. 8 is a schematic top plan view showing an embodiment of a full-wave rectifier of the present invention.
Figure 9:
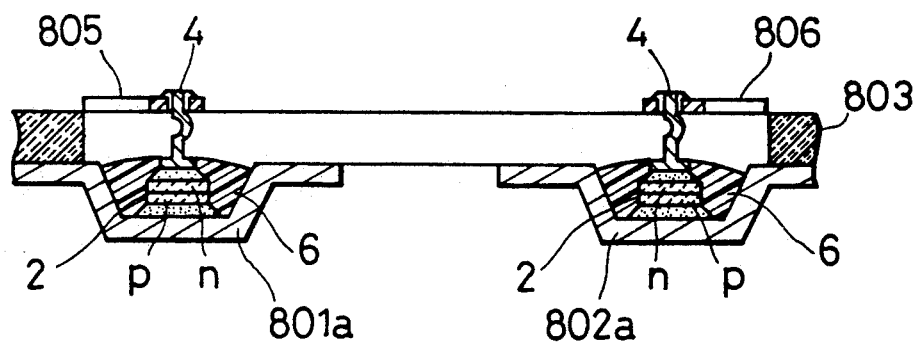
FIG. 9 is a cross-sectional view taken along the line IX—IX FIG. 8.

FIGS. 8 and 9 show an embodiment of a full-wave rectifier in which semiconductor rectifying devices of the present invention are used.

In FIGS. 8 and 9, reference numerals 801 and 802 denote a first and second radiator, respectively, each of which is arc-shaped and has three recessed sections 801a and 802a. The semiconductor chip 2 is bonded to the bottom surface of each recessed section of each radiator in the same manner as shown in FIG. 7. The lead 4 is bonded to the semiconductor chip 2. The recessed sections are filled with the silicone resin layer 6 containing silica powder sufficient to cover the semiconductor chip 2. As a result, the first and second semiconductor rectifying devices are formed. In a semiconductor chip guided to the recessed section 801a of a first radiator 801, a p layer is positioned on the bottom surface thereof. In a semiconductor chip guided to the recessed section 802a of a second radiator 802, an n layer is positioned on the bottom surface thereof. Reference numeral 803 denotes an insulating member whose ring-like portion is open, which is fixedly mounted on the arc-shaped outer edge of the first and second radiators 801 and 802 by means of a screw 804. Thus, the positional relationship between the first and second radiators 801 and 802 is maintained constant. Reference numerals 805 and 806 respectively denote first and second long-piece lead terminals fastened at predetermined intervals on the insulating member 803 by a rivet 807. They are disposed at positions corresponding to the recessed sections 801a and 802a of the radiators 801 and 802, respectively. The longitudinal direction of the long-piece lead terminals 805 and 806 is made in the same direction as the radial direction of a circle made by the insulating member 803, and notches 805a and 806a are disposed on both ends thereof. One of the ends (the internal end) of the first long-piece lead terminal 805 is soldered at the notch 805a with the lead of the first semiconductor rectifying device formed in the first radiator 801. One of the ends (the internal end) of the second long-piece lead terminal 806 is soldered at the notch 806a with the lead of the second semiconductor rectifying device formed in the second radiator 802. The other ends (the external ends) of the first and second long-piece lead terminals 805 and 806 are connected to each other by first, second and third terminals 808, 809 and 810. A three-phase full-wave rectifier is formed as described above with the first and second radiators 801 and 802 as D.C. terminals and the first, second and third terminals as A.C. terminals. This full-wave rectifier is used in a state in which it is fixedly mounted on the exterior of an A.C. generator inside an engine chamber of a vehicle. In the semiconductor rectifying device, the sealing resin is exposed to the outside air even when it is fabricated in a full-wave rectifier. Hence, resistance to salt damage is still required. Therefore, the present invention is applicable to a full-wave rectifier.

Figure 10:
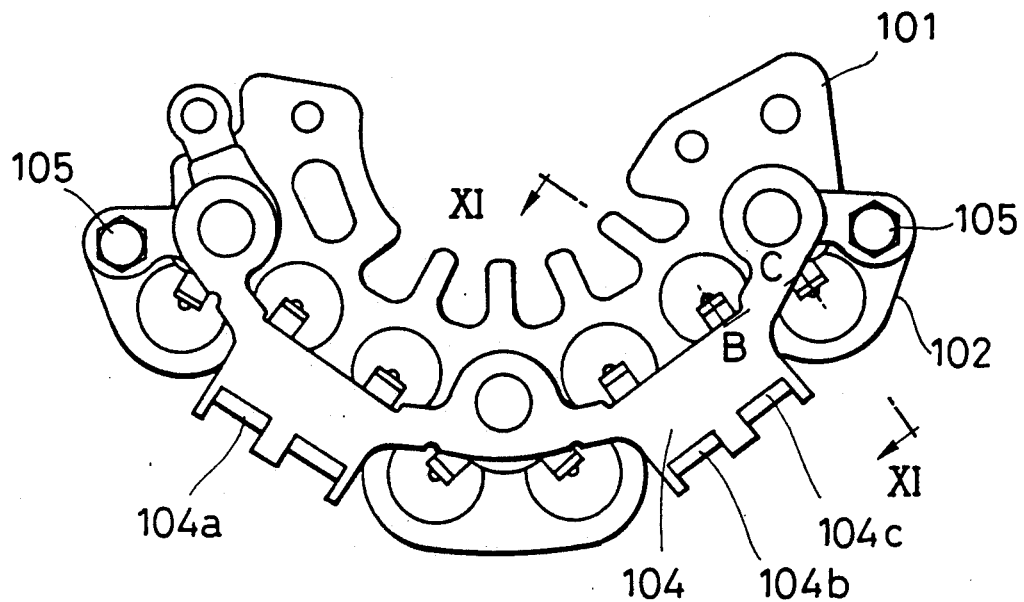
FIG. 10 is a schematic top plan view showing another embodiment of the full-wave rectifier of the present invention.
Figure 11:
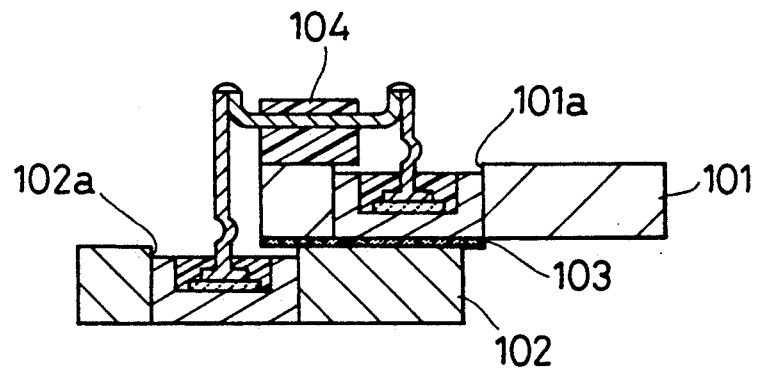
FIG. 11 is a cross-sectional view taken along the line XI-B-C-XI in FIG. 10.

FIGS. 10 and 11 show another embodiment of a full-wave rectifier of the present invention. Points of difference between FIGS. 10 and 11 and FIGS. 8 and 9 are that semiconductor rectifying devices have been constructed as shown in FIG. 6 and they are press-fitted into through holes 101a and 102a formed in a first and second radiator 101 and 102; and that portions of the first radiator 101 and the second radiator 102 are stacked in part on one another via an insulation spacer 103. Reference numeral 104 denotes a resinous terminal base, disposed on the first radiator 101, for holding A.C. terminals 104a, 104b and 104c in one piece. Reference numeral 105 denotes a fastening bolt for fixedly mounting the first radiator 101 and the second radiator 102 together. In FIGS. 10 and 11, four semiconductor rectifying devices are mounted on each of the radiators. Three of them are used for rectification, and the remaining one is used as a neutral-point diode. Since this is not directly related to the present invention, an explanation thereof is omitted. The advantages of this embodiment are the same as those of the embodiment of FIGS. 8 and 9.

Figure 12:
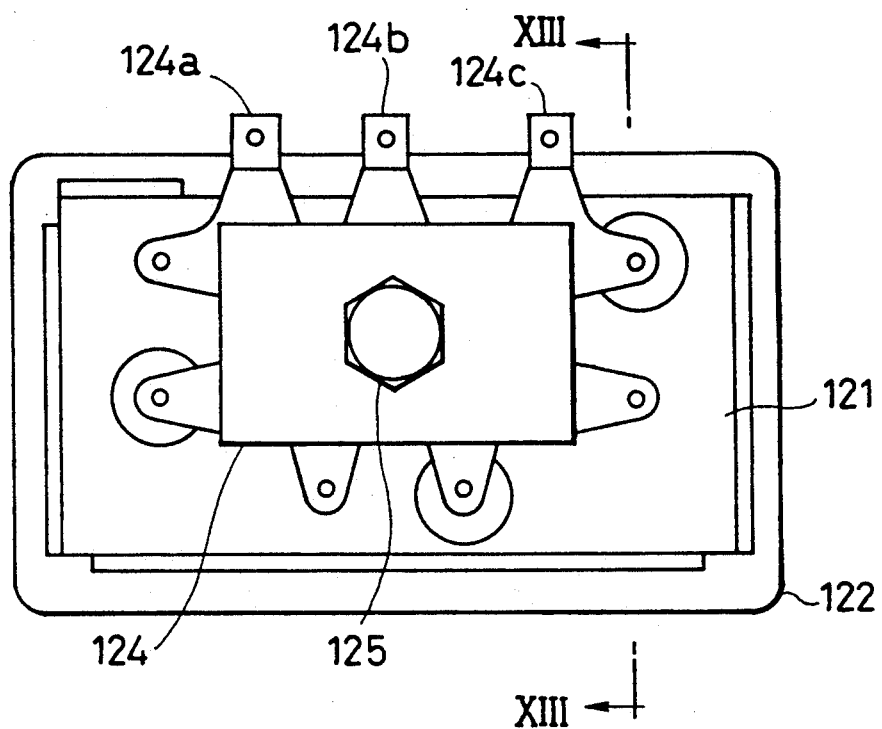
FIG. 12 is a schematic top plan view showing a further embodiment of the full-wave rectifier of the present invention.
Figure 13:
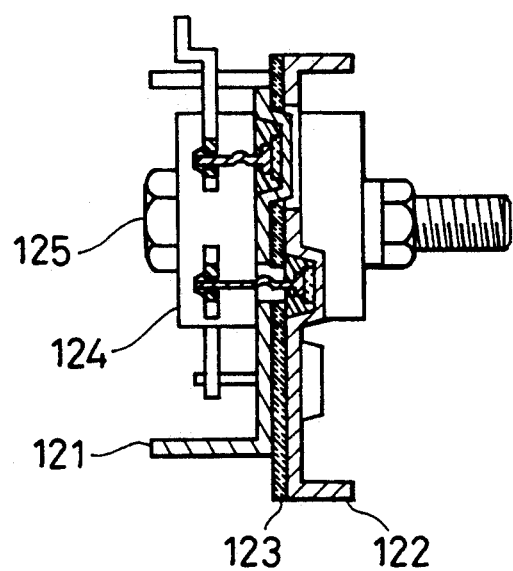
FIG. 13 is a cross-sectional view taken along the line XIII—XIII in FIG. 12.

FIGS. 12 and 13 show a further embodiment of a full-wave rectifier of the present invention. Points of difference between FIGS. 12 and 13 and FIGS. 8 and 9 are that a first radiator 121 and a second radiator 122 are shaped rectangularly and the first radiator 121 and the second radiator 122 are almost completely stacked flush to each other via an insulating spacer 123. Reference numeral 124 denotes a resinous terminal base, disposed on the first radiator 121, for holding A.C. terminals 124a, 124b and 124c in one piece. Reference numeral 125 denotes a fastening bolt for fixedly mounting the the first radiator 121 and the second radiator 122 together. This embodiment also has the same advantages as those of the embodiment of FIGS. 8 and 9.

Since a silicone resin containing silica powder is used as a sealing resin, according to the present invention, it is possible to realize a semiconductor rectifying device having excellent resistance to salt damage and suitable for installation in vehicles and a full-wave rectifier fabricated by using the same device.

Many different embodiments of the present invention may be constructed without departing from the spirit and scope of the present invention. It should be understood that the present invention is not limited to the specific embodiments described in this specification, and is only limited in the appended claims.

What is claimed is:

1. A semiconductor rectifying device, comprising:
   a metallic container;
   a semiconductor chip having a pn junction, one of whose main surfaces is bonded to the bottom surface of the container;
   a lead bonded to the other main surface of the semiconductor chip; and
   a silicone resin layer which covers an exposed portion of the semiconductor chip and contains silica powder, the silica powder having a particle size, and being contained in the silicone resin layer in an amount, such that destruction of siloxane bonding of the silicone resin, by alkali formed from salt, is eliminated, wherein the silicone resin layer contains 40 to 120 parts by weight of silica powder with respect to 100 parts by weight of the silicone resin, and wherein the average particle size of the silica powder is 2 to 6 μm.

2. A semiconductor rectifying device according to claim 1, wherein said lead includes a header section, bonded to the semiconductor chip, and a first lead section, and wherein said silicone resin layer covers the header section.

3. A semiconductor rectifying device according to claim 2, wherein said silicone resin layer reaches said first lead section.

4. A semiconductor rectifying device according to claim 2, further comprising a metallic plate interposed between the header section and the semiconductor chip, so as to relieve thermal stress between the semiconductor chip and the header section.

5. A semiconductor rectifying device according to claim 1, further comprising a metallic plate interposed between the metallic container and the semiconductor chip, so as to relieve thermal stress between the semiconductor chip and the metallic container.

6. A semiconductor rectifying device according to claim 1, wherein the silicone resin layer covers the other main surface of the semiconductor chip.

7. A semiconductor rectifying device, comprising:
a metallic container;
a semiconductor chip having a pn junction, one of whose main surfaces is bonded to the bottom surface of the container;
a lead bonded to the other main surface of the semiconductor chip;
a silicone resin layer which covers an exposed portion of the semiconductor chip and contains silica powder, the silica powder having a particle size, and being contained in the silicone resin layer in an amount, such that destruction of siloxane bonding of the silicone resin, by alkali formed from salt, is eliminated, wherein the silicone resin layer contains 40 to 120 parts by weight of silica powder with respect to 100 parts by weight of the silicone resin, and wherein the average particle size of the silica powder is 2 to 6 μm; and
an epoxy resin layer laminated on the silicone resin layer.

8. A semiconductor rectifying device, comprising:
a metallic container;
a semiconductor chip having a pn junction, one of whose main surfaces is bonded to the bottom surface of the container;
a lead bonded to the other main surface of the semiconductor chip;
a polyimide resin layer which covers an exposed portion of the semiconductor chip; and
a silicone resin layer which is laminated on the polyimide resin layer and contains silica powder, the silica powder having a particle size, and being contained in the silicone resin layer in an amount, such that destruction of siloxane bonding of the silicone resin, by alkali formed from salt, is eliminated, wherein the silicone resin layer contains 40 to 120 parts by weight of silica powder with respect to 100 parts by weight of the silicone resin, and wherein the average particle size of the silica powder is 2 to 6 μm.

9. A full-wave rectifier, comprising
first and second radiators which are electrically insulated and used as D.C.-side terminals;
a plurality of first semiconductor rectifying devices each of which is formed of a metallic container supported on the first radiator, a semiconductor chip having contiguous p and n layers, the p layer being bonded to the bottom surface of the metallic container, a lead bonded to the n layer of the semiconductor chip, and a silicone resin layer which covers the exposed portion of the semiconductor chip and contains silica powder, the silica powder having a particle size, and being contained in the silicone resin layer in an amount, such that destruction of siloxane bonding of the silicone resin, by alkali formed from salt, is eliminated, wherein the silicone resin layers of the first and second semiconductor rectifying devices contain 40 to 120 parts by weight of silica powder with respect to 100 parts by weight of the silicone resin, and wherein the average particle size of the silica powder contained in the silicone resin layers of the first and second semiconductor rectifying devices is 2 to 6 μm;
a plurality of second semiconductor rectifying devices each of which is formed of a metallic container supported on the second radiator, a semiconductor chip having contiguous p and n layers, the n layer being bonded to the bottom surface of the metallic container, a lead bonded to the p layer of the semiconductor chip, and a silicone resin layer which covers the exposed portion of the semiconductor chip and contains silica powder, the silica powder having a particle size, and being contained in the silicone resin layer in an amount, such that destruction of the siloxane bonding of the silicone resin, by alkali formed from salt, is eliminated, wherein the silicone resin layers of the first and second semiconductor rectifying devices contain 40 to 120 parts by weight of silica powder with respect to 100 parts by weight of the silicone resin, and wherein the average particle size of the silica powder contained in the silicone resin layers of the first and second semiconductor rectifying devices is 2 to 6 μm;
a plurality of A.C.-side terminals whose number is the same as the number of phases and through which the leads of the first semiconductor rectifying devices are connected to the leads of the second semiconductor rectifying devices.

10. A full-wave rectifier according to claim 9, wherein an epoxy resin layer is laminated on the silicone resin layers of the first and second semiconductor rectifying devices.

11. A full-wave rectifier according to claim 9, wherein polyimide layers are disposed between the silicone resin layers and the semiconductor chips of the first and second semiconductor rectifying devices.

12. A semiconductor rectifying device, comprising:
a metallic container having a recessed section;
a semiconductor chip having a pn junction, one of whose main surfaces is bonded to the bottom surface of the recessed section of the metallic container;
a lead bonded to the other main surface of the semiconductor chip; and
a silicone resin layer which covers an exposed portion of the semiconductor chip and contains silica powder, the silica powder having a particle size, and being contained in the silicone resin layer in an amount, such that destruction of siloxane bonding of the silicone resin, by alkali formed from salt, is eliminated, wherein the silicone resin layer contains 40 to 120 parts by weight of silica powder with respect to 100 parts by weight of the silicone resin, and wherein the average particle size of the silica powder is 2 to 6 μm.

13. A semiconductor rectifying device according to claim 12, wherein an epoxy resin layer is laminated on the silicone resin layer.

14. A semiconductor rectifying device according to claim 12, wherein a polyimide layer is disposed between the silicone resin layer and the semiconductor chip.

15. A full-wave rectifier, comprising:
first and second radiators which are electrically insulated, each of which has a plurality of recessed sections and are used as D.C.-side terminals;
a plurality of first semiconductor chips having contiguous p and n layers, the p layer being bonded to the bottom surface of each recessed section of the first radiator;
a plurality of second semiconductor chips having contiguous pa nd n layers, the n layer being bonded to the bottom surface of each recessed section of the second radiator;
a first lead bonded to the n layer of the first semiconductor chip;
a second lead bonded to the p layer of the second semiconductor chip;
a silicone resin layer which covers the exposed portions of the first and second semiconductor chips and contains silica powder, the silica powder having a particle size, and being contained in the silicone resin layer in an amount, such that destruction of siloxane bonding of the silicone resin, by alkali formed from salt, is eliminated, wherein the silicone resin layer contains 40 to 120 parts by weight of silica powder with respect to 100 parts by weight of the silicone resin, and wherein the average particle size of the silica powder is 2 to 6 μm.

16. A semiconductor rectifying device, comprising:
a metallic container;
a semiconductor chip having a pn junction, one of whose main surfaces is bonded to the bottom surface of the container;
a lead bonded to the other main surface of the semiconductor chip; and
a silicon resin layer which covers an exposed portion of the semiconductor ship and contains silica powder, the silica powder having a particle size, and being contained in the silicone resin layer in an amount, such that destruction of siloxane bonding of the silicone resin, by alkali formed form salt, is eliminated, wherein the silicone resin layer contains 80 to 100 parts by weight of silica powder with respect to 100 parts by weight of the silicone resin, and wherein the silica powder has an average particle size of 2 to 6μm.

17. A semiconductor rectifying device according to claim 1, wherein the silica powder contains at most 10 ppm of each of Na and K.

* * * * *